(12) United States Patent
Derner et al.

(10) Patent No.: US 10,998,027 B2
(45) Date of Patent: May 4, 2021

(54) MEMORY CIRCUITRY

(71) Applicant: Micron Technology, Inc., Boise, ID (US)

(72) Inventors: Scott J. Derner, Boise, ID (US); Charles L. Ingalls, Meridian, ID (US); Tae H. Kim, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 246 days.

(21) Appl. No.: 16/035,147

(22) Filed: Jul. 13, 2018

(65) Prior Publication Data

US 2019/0019544 A1 Jan. 17, 2019

Related U.S. Application Data

(60) Provisional application No. 62/533,205, filed on Jul. 17, 2017.

(51) Int. Cl.
*G11C 11/22* (2006.01)
*H01L 27/1159* (2017.01)
*H01L 27/11592* (2017.01)
*G11C 5/02* (2006.01)

(52) U.S. Cl.
CPC ............ *G11C 11/223* (2013.01); *G11C 5/025* (2013.01); *G11C 11/2255* (2013.01); *G11C 11/2257* (2013.01); *G11C 11/2259* (2013.01); *G11C 11/2273* (2013.01); *H01L 27/1159* (2013.01); *H01L 27/11592* (2013.01)

(58) Field of Classification Search
CPC ... G11C 5/025; G11C 11/223; G11C 11/2255; G11C 11/2257; G11C 11/2259; G11C 11/2273; H01L 27/1159; H01L 27/11592
See application file for complete search history.

(56) References Cited

U.S. PATENT DOCUMENTS

| | | | | |
|---|---|---|---|---|
| 7,359,273 B2 * | 4/2008 | Cho | ........................ | G11C 5/025 365/230.01 |
| 8,860,117 B2 * | 10/2014 | Tanzawa | ........... | H01L 21/02532 257/314 |
| 9,679,650 B1 * | 6/2017 | Sakui | ................ | H01L 27/11524 |
| 9,818,757 B2 * | 11/2017 | Ikeda | ................ | H01L 27/11582 |
| 10,366,738 B2 * | 7/2019 | Derner | ................ | H01L 29/7827 |

(Continued)

FOREIGN PATENT DOCUMENTS

| WO | WO 2017-034647 | 3/2017 |
|---|---|---|
| WO | PCT/US2018/040581 | 11/2018 |
| WO | PCT/US2018/040581 | 1/2020 |

OTHER PUBLICATIONS

Lapedus, Mark, "How to Make 3D NAND," Semiconductor Engineering, May 23, 2016, URL <http://semiengineering.com/how-to-make-3d-nand/> (Year: 2016).*

*Primary Examiner* — Richard Elms
*Assistant Examiner* — R Lance Reidlinger
(74) *Attorney, Agent, or Firm* — Wells St. John P.S.

(57) ABSTRACT

Some memory circuitry comprises a stack of multiple tiers individually comprising memory cells individually comprising an elevationally-extending transistor. The tiers individually comprise multiple access lines that individually electrically couple together a row of the memory cells in that individual tier. The tiers individually comprise access-line-driver circuitry comprising an elevationally-extending transistor.

27 Claims, 9 Drawing Sheets

(56) References Cited

U.S. PATENT DOCUMENTS

| | | | |
|---|---|---|---|
| 2004/0262635 A1* | 12/2004 | Lee | H01L 29/792 257/199 |
| 2008/0112251 A1* | 5/2008 | Youn | G11C 5/063 365/230.03 |
| 2009/0283737 A1* | 11/2009 | Kiyotoshi | H01L 27/1021 257/2 |
| 2011/0261607 A1 | 10/2011 | Tang et al. | |
| 2012/0063256 A1* | 3/2012 | Kim | G11C 8/14 365/230.06 |
| 2012/0153357 A1 | 6/2012 | Tang et al. | |
| 2015/0279855 A1 | 10/2015 | Lu et al. | |
| 2016/0020389 A1* | 1/2016 | Ratnam | G11C 16/24 257/2 |
| 2017/0162592 A1 | 6/2017 | Nishikawa et al. | |

\* cited by examiner

MEMORY CIRCUITRY

TECHNICAL FIELD

Embodiments disclosed herein pertain to memory circuitry.

BACKGROUND

Memory is one type of integrated circuitry, and is used in computer systems for storing data. Memory may be fabricated in one or more arrays of individual memory cells. Memory cells may be written to, or read from, using digit lines (which may also be referred to as bit lines, data lines, or sense lines) and access lines (which may also be referred to as word lines). The sense lines may conductively interconnect memory cells along columns of the array, and the access lines may conductively interconnect memory cells along rows of the array. Each memory cell may be uniquely addressed through the combination of a sense line and an access line.

Memory cells may be volatile, semi-volatile, or non-volatile. Non-volatile memory cells can store data for extended periods of time in the absence of power. Non-volatile memory is conventionally specified to be memory having a retention time of at least about 10 years. Volatile memory dissipates, and is therefore refreshed/rewritten to maintain data storage. Volatile memory may have a retention time of milliseconds or less. Regardless, memory cells are configured to retain or store memory in at least two different selectable states. In a binary system, the states are considered as either a "0" or a "1". In other systems, at least some individual memory cells may be configured to store more than two levels or states of information.

A capacitor is one type of electronic component that may be used in a memory cell. A capacitor has two electrical conductors separated by electrically insulating material. Energy as an electric field may be electrostatically stored within such material. Depending on composition of the insulator material, that stored field will be volatile or non-volatile. For example, a capacitor insulator material including only $SiO_2$ will be volatile. One type of non-volatile capacitor is a ferroelectric capacitor which has ferroelectric material as at least part of the insulating material. Ferroelectric materials are characterized by having two stable polarized states and thereby can comprise programmable material of a capacitor and/or memory cell. The polarization state of the ferroelectric material can be changed by application of suitable programming voltages, and remains after removal of the programming voltage (at least for a time). Each polarization state has a different charge-stored capacitance from the other, and which ideally can be used to write (i.e., store) and read a memory state without reversing the polarization state until such is desired to be reversed. Less desirable, in some memory having ferroelectric capacitors the act of reading the memory state can reverse the polarization. Accordingly, upon determining the polarization state, a re-write of the memory cell is conducted to put the memory cell into the pre-read state immediately after its determination. Regardless, a memory cell incorporating a ferroelectric capacitor ideally is non-volatile due to the bi-stable characteristics of the ferroelectric material that forms a part of the capacitor. Programmable materials other than ferroelectric materials may be used as a capacitor insulator to render capacitors non-volatile.

A field effect transistor is one type of electronic component that may be used in a memory cell. These transistors comprise a pair of conductive source/drain regions having a semiconductive channel region there-between. A conductive gate is adjacent the channel region and separated there-from by a thin gate insulator. Application of a suitable voltage to the gate allows current to flow from one of the source/drain regions to the other through the channel region. When the voltage is removed from the gate, current is largely prevented from flowing through the channel region. Field effect transistors may also include additional structure, for example reversibly programmable charge storage/trap regions as part of the gate construction between the gate insulator and the conductive gate.

One type of transistor is a ferroelectric field effect transistor (FeFET) wherein at least some portion of the gate construction (e.g., the gate insulator) comprises ferroelectric material. The two different polarized states of the ferroelectric material in field effect transistors may be characterized by different threshold voltage ($V_t$) for the transistor or by different channel conductivity for a selected operating voltage. Again, polarization state of the ferroelectric material can be changed by application of suitable programming voltages, and which results in one of high channel conductance or low channel conductance. The high and low conductance, invoked by the ferroelectric polarization state, remains after removal of the gate programming voltage (at least for a time). The status of the channel can be read by applying a small drain voltage which does not disturb the ferroelectric polarization. Programmable materials other than ferroelectric materials may be used as a gate insulator to render a transistor to be non-volatile.

Access-line-driver circuitry is typically associated with each access line to apply suitable voltages during read, write, and erase operations. Further, sense amplifiers are typically electrically coupled with one or more bit lines which at least in part are used to detect what value is stored in a memory cell and reporting that value amplified at an output of the sense amplifier.

DETAILED DESCRIPTION OF EXAMPLE EMBODIMENTS

Embodiments of the invention encompass memory circuitry. A first example embodiment is shown in and described with reference to FIGS. 1-6. Such includes a substrate structure or construction 8 comprising memory circuitry 10 fabricated relative to a base substrate 11 (shown in FIG. 1 only). Example base substrate 11 may comprise any one or more of conductive/conductor/conducting (i.e., electrically herein), semiconductive/semiconductor/semiconducting, and insulative/insulator/insulating (i.e., electrically herein) materials. Various materials have been formed elevationally over base substrate 11. Materials may be aside, elevationally inward, or elevationally outward of the FIGS. 1-6-depicted materials. For example, other partially or wholly fabricated components of integrated circuitry may be provided somewhere above, about, or within base substrate 11. Control and/or other peripheral circuitry for operating components within a memory array may also be fabricated, and may or may not be wholly or partially within a memory array or sub-array. Further, multiple sub-arrays may also be fabricated and operated independently, in tandem, or otherwise relative one another. As used in this document, a "sub-array" may also be considered as an array.

Figure 1:
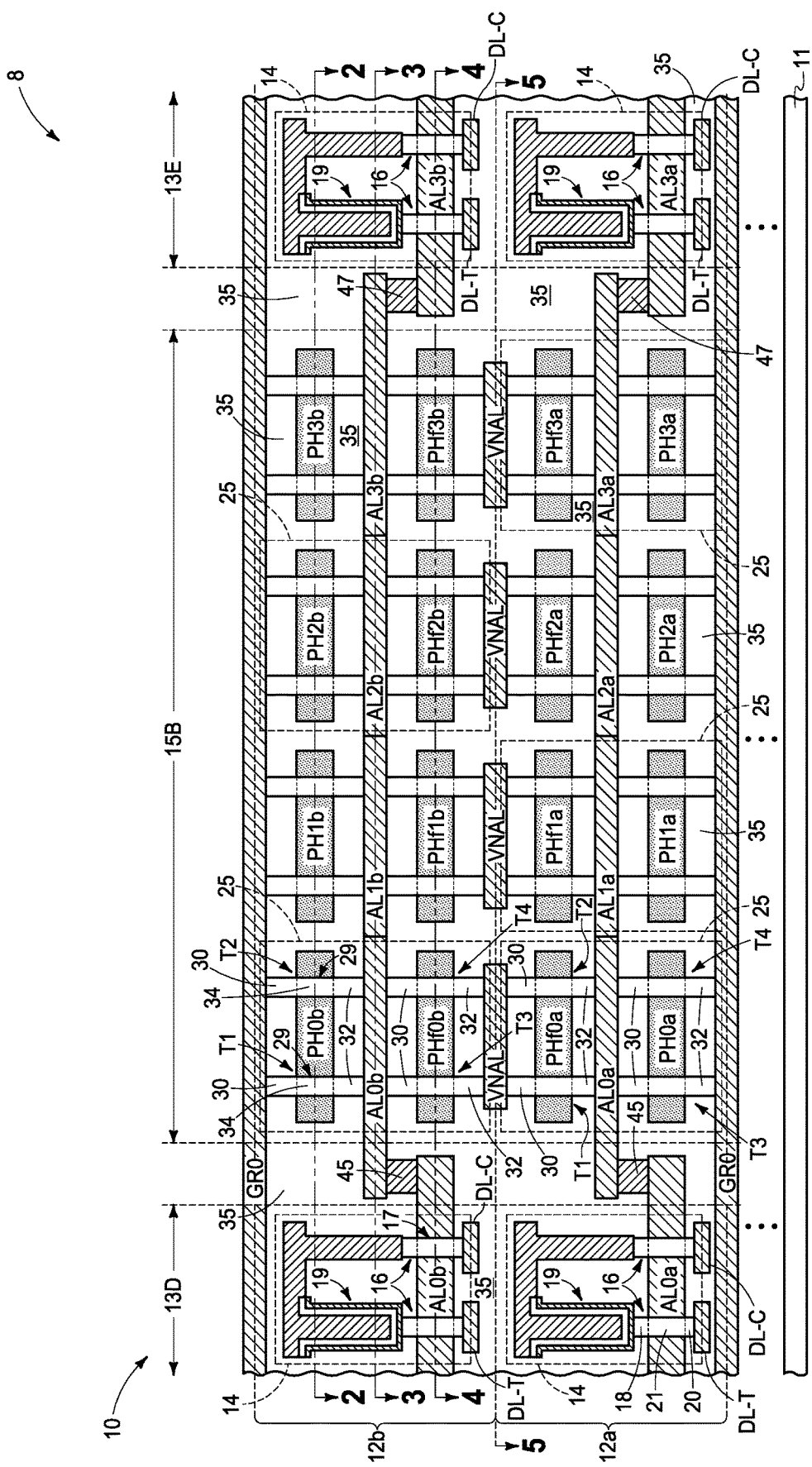
FIG. 1 is a diagrammatic vertical cross-sectional view of memory circuitry in accordance with an embodiment of the invention.
Figure 2:
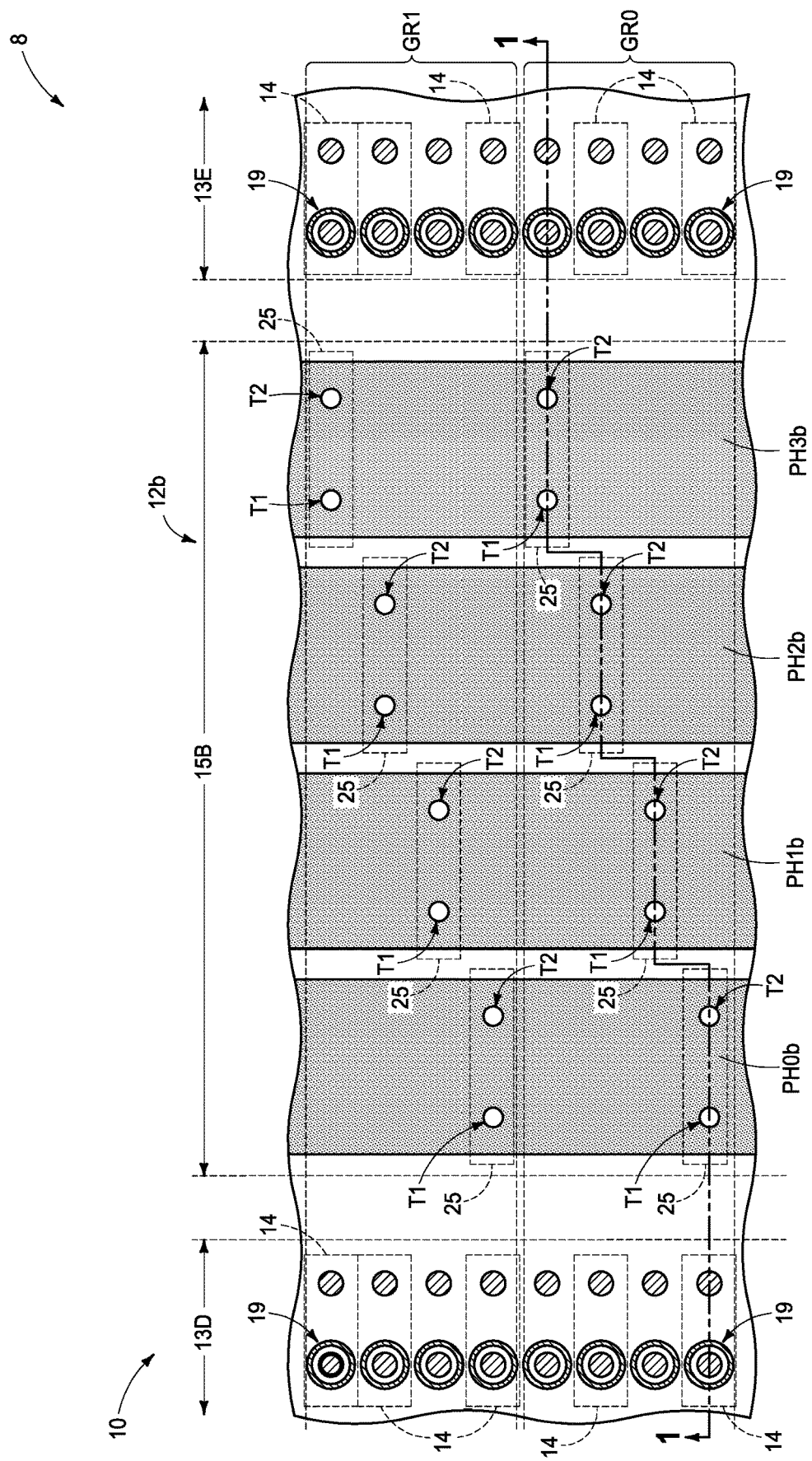
FIG. 2 is a cross-sectional view taken through line 2-2 in FIG. 1.
Figure 3:
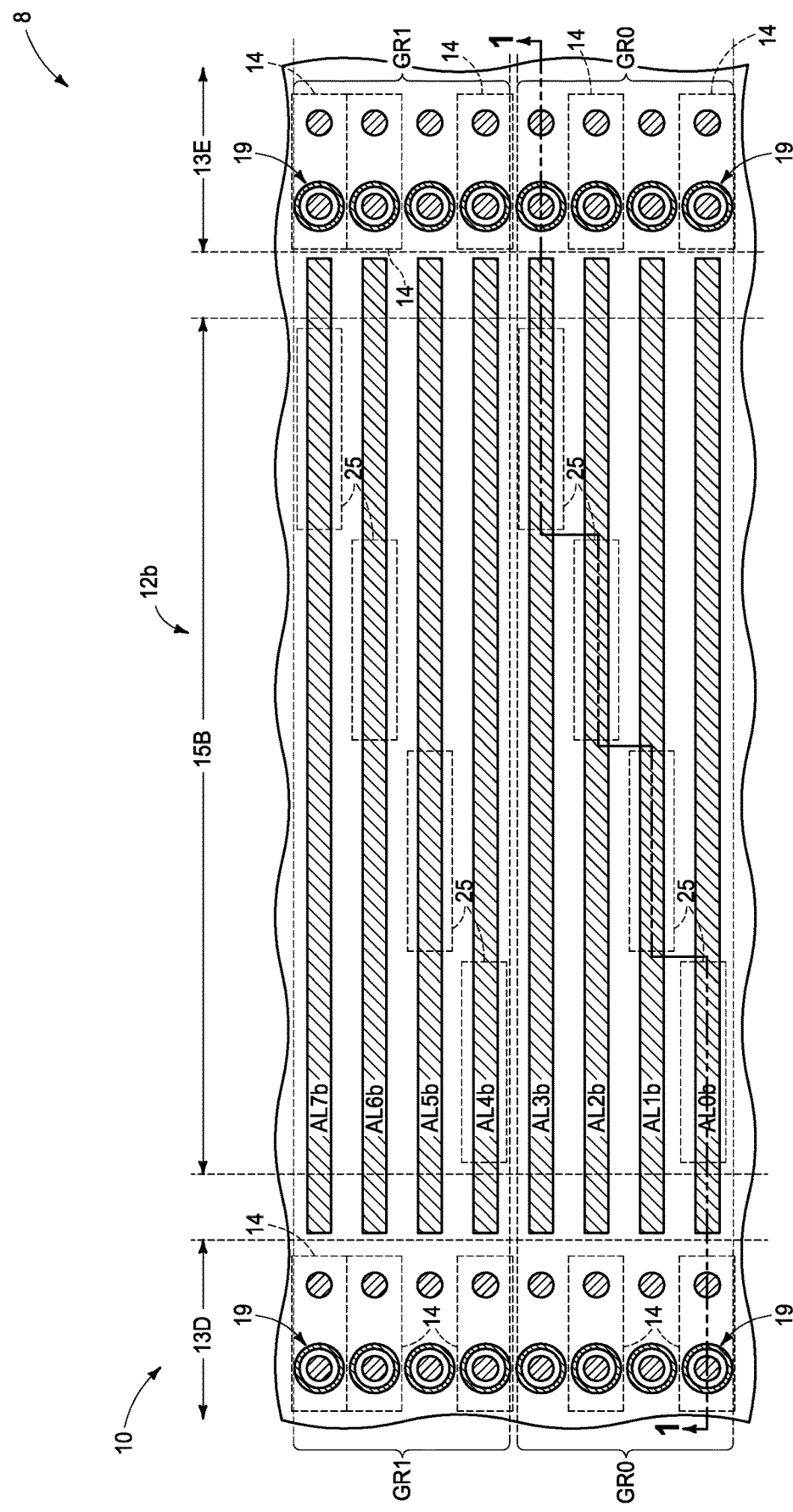
FIG. 3 is a cross-sectional view taken through line 3-3 in FIG. 1.
Figure 4:
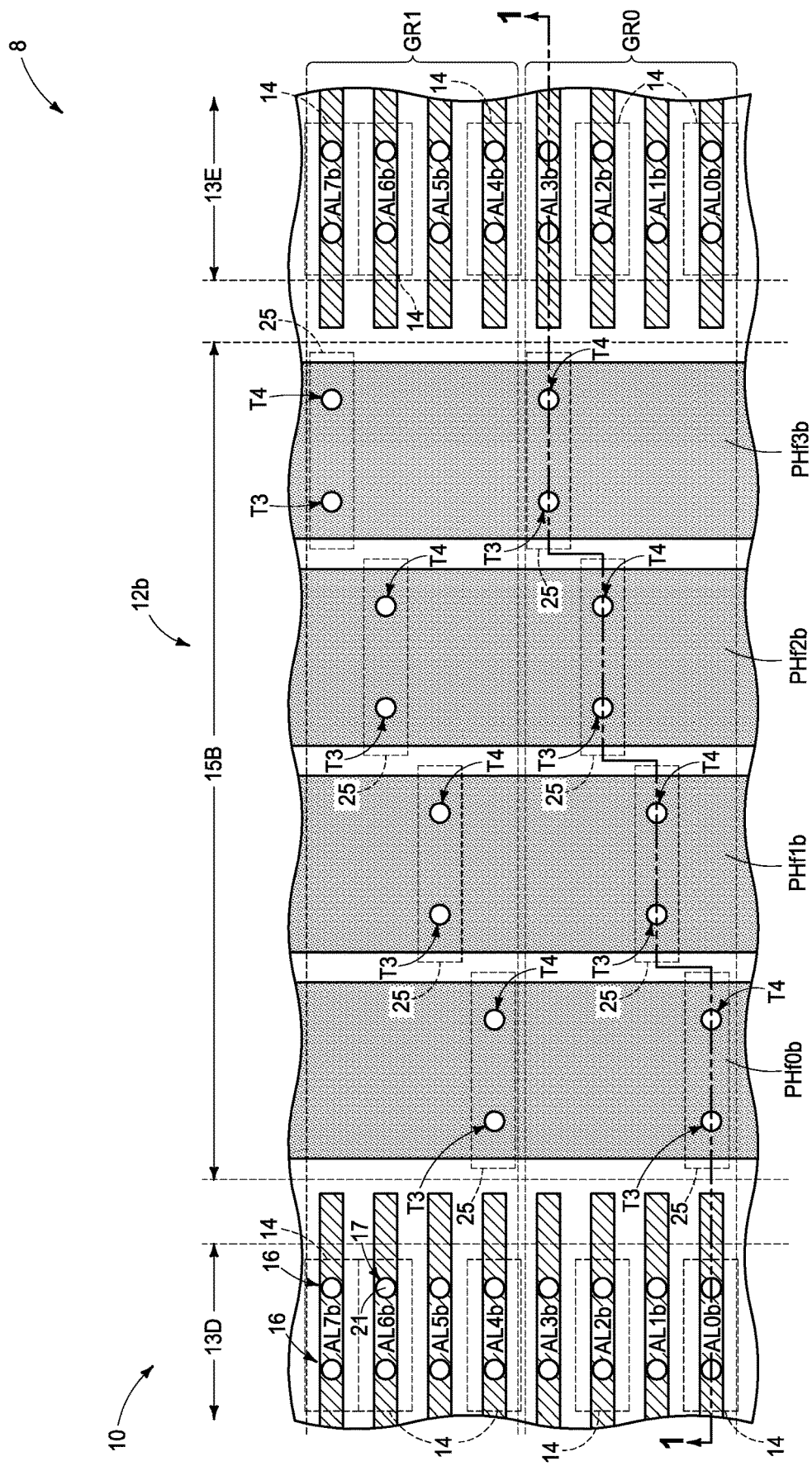
FIG. 4 is a cross-sectional view taken through line 4-4 in FIG. 1.
Figure 5:
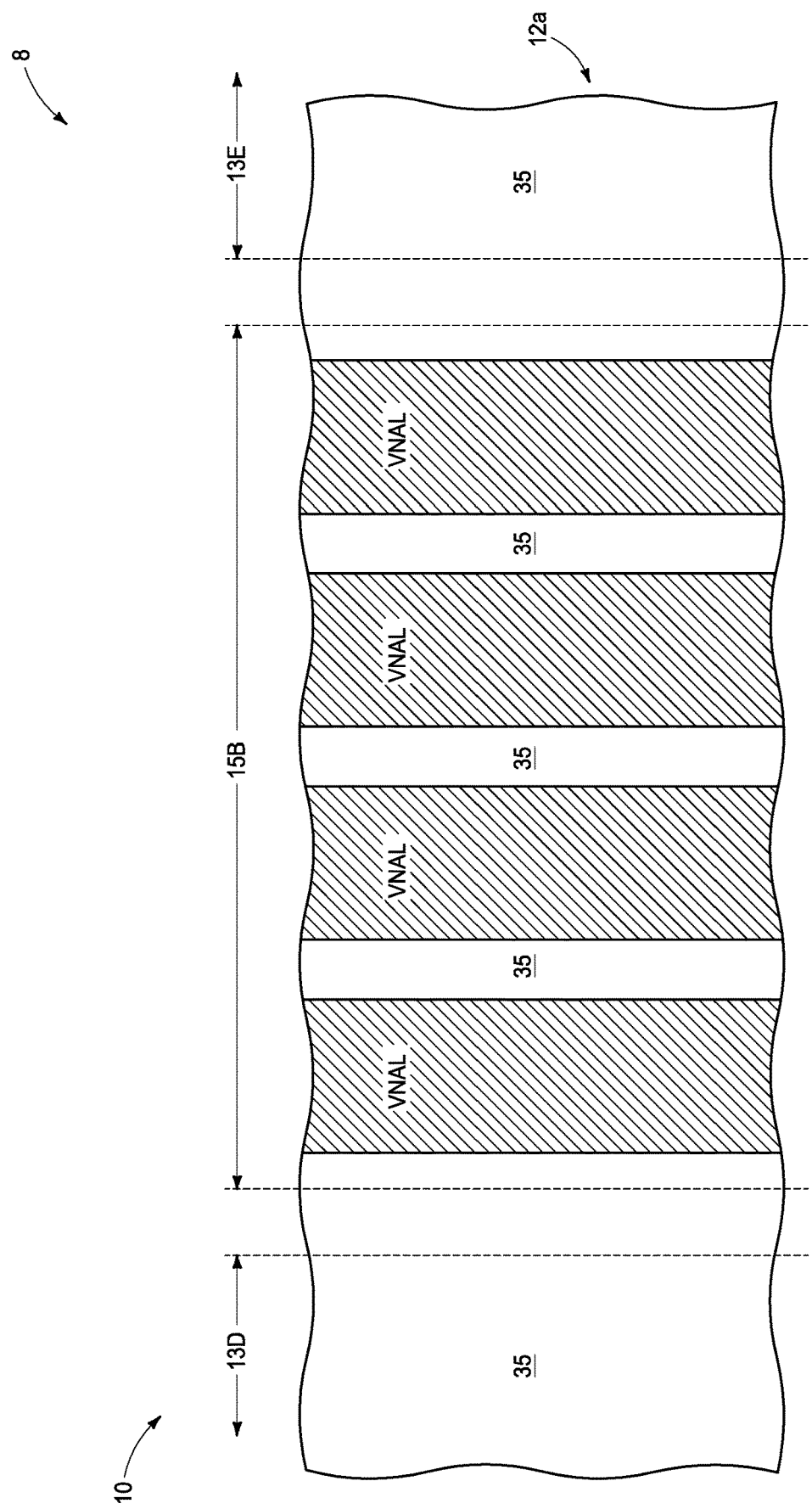
FIG. 5 is a cross-sectional view taken through line 5-5 in FIG. 1.
Figure 6:
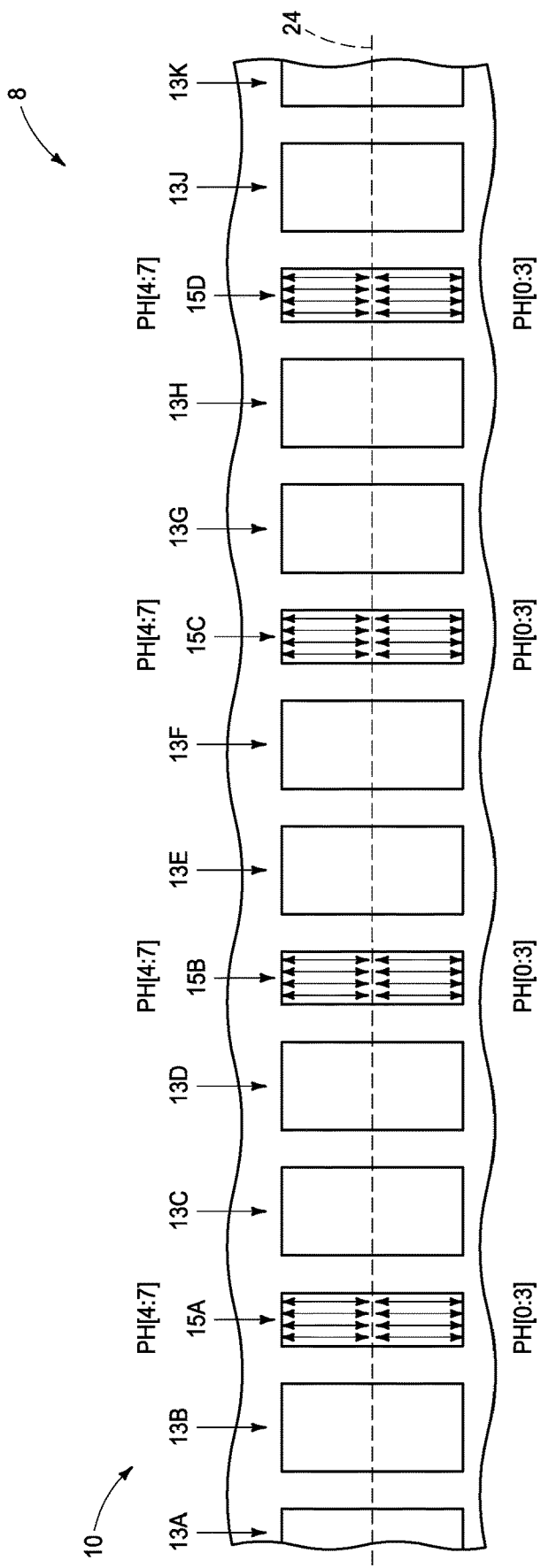
FIG. 6 is a diagrammatic expanded and reduced-scale horizontal representation of certain portions of the memory circuitry of FIG. 1.

In some embodiments, memory circuitry 10 comprises multiple memory-array stacks 13 (e.g., FIG. 6 showing stacks 13A, 13B, 13C, 13D, 13E, 13F, 13G, 13I-1, 13J, and 13K) individually having multiple tiers 12 (e.g., FIG. 1 showing tiers 12a and 12b), with tiers 12 individually comprising memory cells 14. Only some dashed outlines of individual memory cells 14 are shown in FIGS. 2-4 for clarity in such figures. Memory circuitry 10 may comprise fewer or more memory-array stacks (e.g., dozens, hundreds, thousands, etc.) and more tiers (e.g., dozens, hundreds, thousands, etc.). Example memory-array stacks 13 may be considered as being horizontally spaced from one another along a horizontal line 24 (FIG. 6) which may be straight (as shown), curvilinear (not shown), a combination of straight and curved segments (not shown), etc. Further, multiple (not shown) horizontal lines of horizontally spaced memory-array stacks would likely be fabricated.

Memory circuitry 10 in the example embodiment comprises a stack 15 (e.g., stacks 15A, 15B, 15C, and 15D) of access-line-driver circuitry between every other immediately-adjacent memory-array stack 13. In one embodiment and as shown, there is no stack of any access-line driver circuitry in horizontal line 24 (FIG. 6) between any two immediately-adjacent memory-array stacks 13 other than between said every other immediately-adjacent memory-array stack 15. For example, in the depicted embodiment, a stack of access-line-driver circuitry 15 is between every other immediately-adjacent two memory-array stacks 13B and 13C (15A), 13D and 13E (15B), 13F and 13G (15C), and 13H and 13J (15D), with no access-line-driver circuitry of any kind being in horizontal line 24 (FIG. 6) between immediately-adjacent memory-array stacks 13A and 13B, 13C and 13D, 13E and 13F, 13G and 13H, and 13J and 13K.

Individual tiers 12 within an individual stack 13 likely may comprise thousands, tens of thousands, hundreds of thousands, etc. of memory cells 14. Memory cells 14 may individually comprise one or more elevationally-extending transistor(s) 16, with the example embodiment having two elevationally-extending transistors per memory cell 14. In one embodiment and as shown, individual elevationally-extending transistors 16 are vertical or within 10° of vertical. In one embodiment, memory cells 14 individually comprise a capacitor 19. In the depicted example, individual memory cells 14 comprise a two transistor-one capacitor (2T-1C) memory cell. Alternate configuration memory cells may be used, for example which include more or fewer transistors and more or no capacitor(s).

Tiers 12 individually comprise multiple access lines AL (e.g., 512 AL0-AL511 per memory-array stack 13, with FIG. 4 showing AL0b, AL1b, AL2b, AL3b, AL4b, AL5b, AL6b, and AL7b) that individually electrically couple together a row of memory cells 14 in that individual tier 12. Portions of access lines AL comprise a gate of individual elevationally-extending transistors 16 which in the depicted embodiment comprise a pillar 17 having vertically-opposed upper and lower source/drain regions 18 and 20, respectively, and a channel region 21 elevationally there-between. In one embodiment and as shown, tiers 12 individually comprise multiple digit lines (DL-T and DL-C) that individually electrically couple together a column of memory cells 14 in that individual tier 12.

Tiers 12 also individually comprise access-line-driver circuitry 25 that in some embodiments comprises an elevationally-extending transistor. Only some dashed outlines of access-line-driver circuitry 25 are shown in FIGS. 1-4 for clarity in such figures. In one embodiment, and as shown, individual access-line-driver circuitry 25 in individual tiers 12 is horizontally spaced from all of memory cells 14 in individual tiers 12.

Any existing or yet-to-be-developed access-line-driver circuitry may be used. In one embodiment and as shown, access-line-driver circuitry 25 of individual stacks 15 is in individual tiers 12 and individually comprises multiple elevationally-extending transistors that individually electrically couple, in one embodiment directly electrically couple, to different individual access lines AL in that individual tier 12 in each memory-array stack 13 that is immediately adjacent that individual stack 15 along horizontal line 24 (FIG. 6). For example, and by way of example only, access-line-driver circuitry 25 (e.g., which may be considered as local access-line-driver circuitry 25) is shown as individually having four elevationally-extending transistors T1, T2, T3, and T4 (FIG. 1). Accordingly, any one transistor T1, T2, T3, or T4 within a single access-line-driver circuitry 25 comprises one of multiple elevationally-extending transistors that individually electrically couple to a different individual access line AL in that individual tier 12. Example individual elevationally-extending transistors T1, T2, T3, and T4 are shown as comprising a pillar 29 having upper and lower source/drain regions 30 and 32, respectively, and a channel region 34 there-between. In one embodiment, the access-line-driver circuitry in each stack 15 with respect to each tier 12 may control each access line in each memory-array stack 13 between which the respective stack 15 is positioned.

In one embodiment, elevationally-extending transistors T1, T2, T3, and T4 are vertical or within 10° of vertical. In one embodiment, individual access-line-driver circuitry 25 comprises at least two elevationally-extending transistors that individually electrically couple to the same one of the different individual access lines (e.g., any two of T1, T2, T3, and T4 which electrically couple to a single access line AL). In one such embodiment, one of the at least two elevationally-extending transistors of individual access-line-driver circuitry 25 in that individual tier 12 is above, in one embodiment directly above, another of the at least two elevationally-extending transistors. For example, each of transistors T1 and T2 is above each of transistors T3 and T4, with transistor T1 being directly above transistor T3 and transistor T2 being directly above transistor T4 in individual access-line-driver circuitry 25.

Upper source/drain regions 30 of transistors T1 and T2 in tier 12b are shown electrically coupling (e.g., directly) with an upper global row line GR (e.g., upper GR0 in FIG. 1)

which increment and electrically couple together (e.g., directly) four access lines AL (as shown in FIGS. 2 and 4, and which may be considered or numbered GR0-GR63 in two sets and 512 access lines AL0-AL511). Lower source/drain regions 32 of transistors T3 and T4 in tier 12a are shown electrically coupling (e.g., directly) with a lower global row line GR (e.g., lower GR0 in FIG. 1) which also increment and electrically couple together (e.g., directly) four access lines AL (upper and lower GR0's may be common to tiers 12a and 12b, another overlying pair of GR0's [not shown] common to tiers 12c and 12d [not shown], etc.) Lower source/drain regions 32 of transistors T1 and T2 in tier 12b electrically couple (e.g., directly) with a respective access line AL extending laterally across individual access-line-driver circuitry stacks 15. Upper source/drain regions 30 of transistors T3 and T4 in tier 12b electrically couple (e.g., directly) with a respective access line AL extending laterally across individual access-line-driver circuitry stacks 15. Access lines AL within stacks 15 and stacks 13, by way of example only, are shown as being at different elevations, and are individually electrically coupled (e.g., directly) relative one another by a pair of conductive vias 45, 47 in each tier.

In one embodiment, multiple physically-parallel gate lines are between immediately-adjacent memory cell stacks 13 within stacks 15 in horizontal line 24 (FIG. 6) in individual tiers 12. Such individually electrically couple together (e.g., directly) a column of the elevationally-extending transistors of the access-line-driver circuitry in that individual tier. By way of example only, such are shown with respect to transistor T1 and T2 as being four gate lines PH numbered 0-3, and with respect to transistors T3 and T4 as being four gate lines PHf numbered 0-3. Accordingly, portions of gate lines PH function as gates of individual transistors T1 and T2 and portions of gates PHf function as gates of individual transistors T3 and T4. Further, and by way of example only, lines PH and lines PHf may comprise part of or extensions of access-line-driver circuitry (not shown) that is at edges of or peripheral to individual stacks 15, for example which receive from a differential comparator signals of an in-phase (truth) and an opposite phase (false), respectively, with respect to an input signal. Example gate lines PH and PHf may extend the length of a tier 12 within an array stack 13. Alternately, such may be in two or more sets. As but one example and with respect to a 512 access line AL0-511 tier array, sets PH0-PH3 and PHf0-PHf3 may be coupled with AL0-AL255 and sets PH4-PH7 and PHf4-PHf7 may be coupled with AL256-AL511 (FIG. 6).

Additional multiple physically-parallel conductive lines VNAL are between and a part of tiers 12a and 12b. Such are shown as electrically coupling (e.g., directly) with source/drain regions 32 of transistors T3 and T4 in tier 12b and with source/drain regions 30 of transistors T1 and T2 in tier 12a. Such may comprise part of or extensions of access-line-driver circuitry (not shown) that is at edges of or peripheral to individual stacks 15.

In one embodiment, at least one of the at least two elevationally-extending transistors of individual access-line-driver circuitry 25 is circuit-parallel with another of the at least two elevationally-extending transistors. For example, in the depicted embodiment, transistor T1 is circuit-parallel with transistor T2 and transistor T3 is circuit-parallel with transistor T4 in individual access-line-driver circuitry 25. More circuit-parallel transistors (not shown) may be used with respect to gate lines PH and/or PHf as current drive requirements may warrant, or only a single transistor (e.g., no circuit-parallel transistors, and not shown) may be used with respect to gate lines PH and/or PHf. In one embodiment, at least one of the at least two elevationally-extending transistors of individual access-line-driver circuitry 25 is not circuit-parallel with another of the at least two elevationally-extending transistors. For example, neither transistor T1 nor transistor T2 is circuit-parallel with either transistor T3 or T4, and neither transistor T3 nor transistor T4 is circuit-parallel with either transistor T1 or T2 in individual access-line-driver circuitry 25.

Insulator material 35 (e.g., silicon dioxide and/or silicon nitride) is shown surrounding the various operative components described above. Example materials for components AL, DL-T, DL-C, GR, PH, PHf, VNAL, 45, and 47 are metal materials and conductively-doped semiconductor material such as polysilicon. Example materials for the different region of pillars 17 and 29 are variously and appropriately doped semiconductive material.

In one embodiment and as shown, each access-line-driver circuitry 25 is electrically coupled (e.g., directly) with an access line AL in each tier 12 in immediately-adjacent memory-array stack 13 in horizontal line 24 (FIG. 6), thus servicing both such memory-array stacks (e.g., with respect to stack 15B, the immediately-adjacent left and right memory-array stacks 13D and 13E).

In one embodiment, memory circuitry (e.g., 10) comprises first, second, and third memory-array stacks (e.g., 13D, 13E, 13F, respectively) individually having multiple tiers (e.g., 12) individually comprising memory cells (e.g., 14). The memory cells individually comprise an elevationally-extending transistor (e.g., 16). The tiers individually comprise multiple access lines (e.g., AL) that individually electrically couple together a row of the memory cells in that individual tier. The memory-array stacks are horizontally spaced from one another along a horizontal line (e.g., 24 in FIG. 6). The second memory-array stack (e.g., 13E) is between, horizontally spaced from, and immediately adjacent to each of the first (e.g., 13D) and third (e.g., 13F) memory-array stacks in the horizontal line. A stack (e.g., 15B) of access-line-driver circuitry is between the second memory-array stack and one of the first or third memory-array stacks (e.g., 13D) in the horizontal line. The access-line-driver circuitry (e.g., 25) is in individual of the tiers and individually comprises multiple elevationally-extending transistors (e.g., any two or more of T1, T2, T3, and T4) that individually electrically couple to different individual of the access lines in that individual tier in each of the second memory-array stack and the one (e.g., 13D) first or third memory-array stack. There is no stack of any access-line-driver circuitry between the second memory-array stack and the other (e.g., 13F) of the first or third memory-array stack in the horizontal line.

Figure 7:
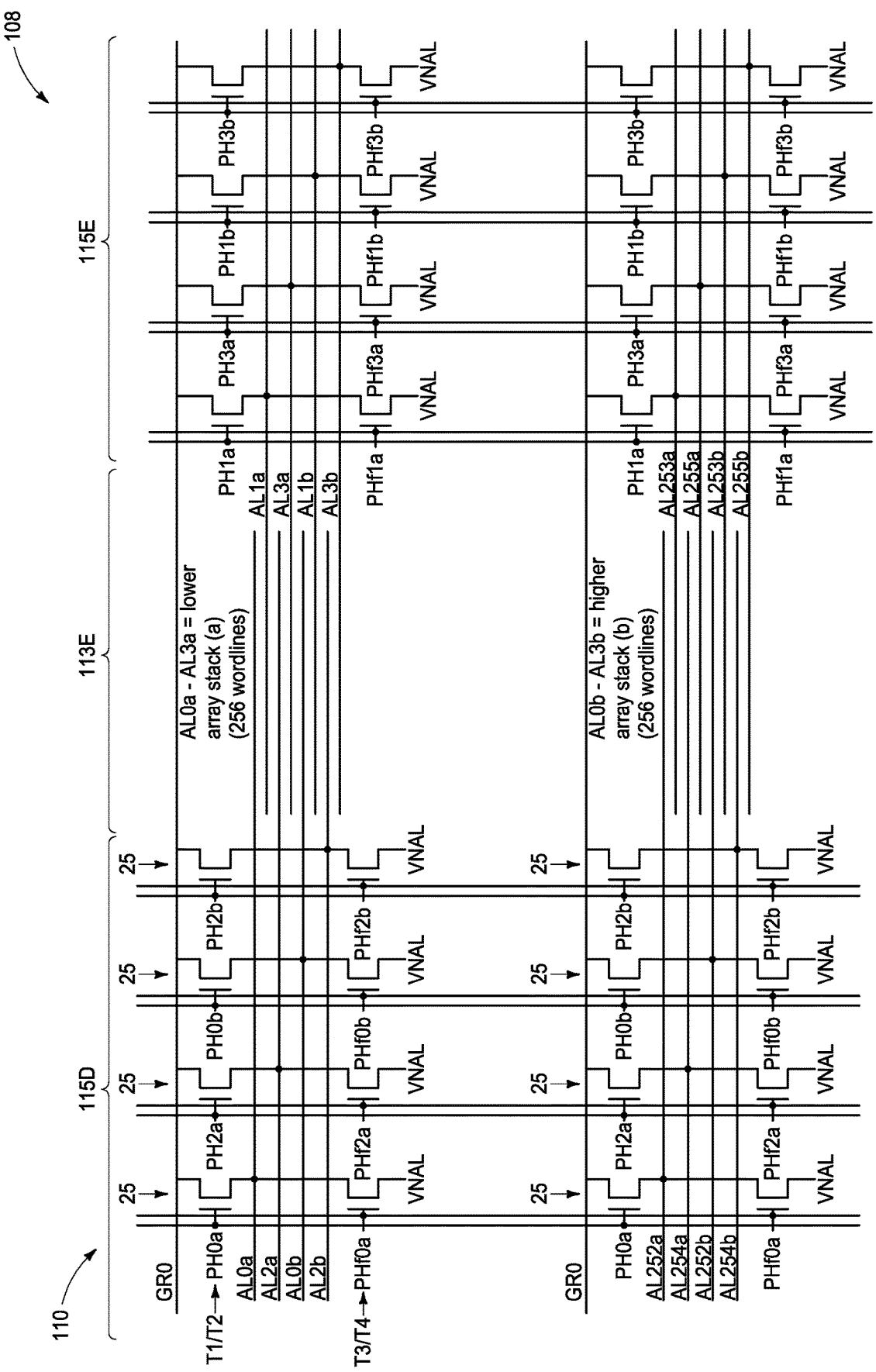
FIG. 7 is a diagrammatic schematic figure of memory circuitry in accordance with an embodiment of the invention.
Figure 8:
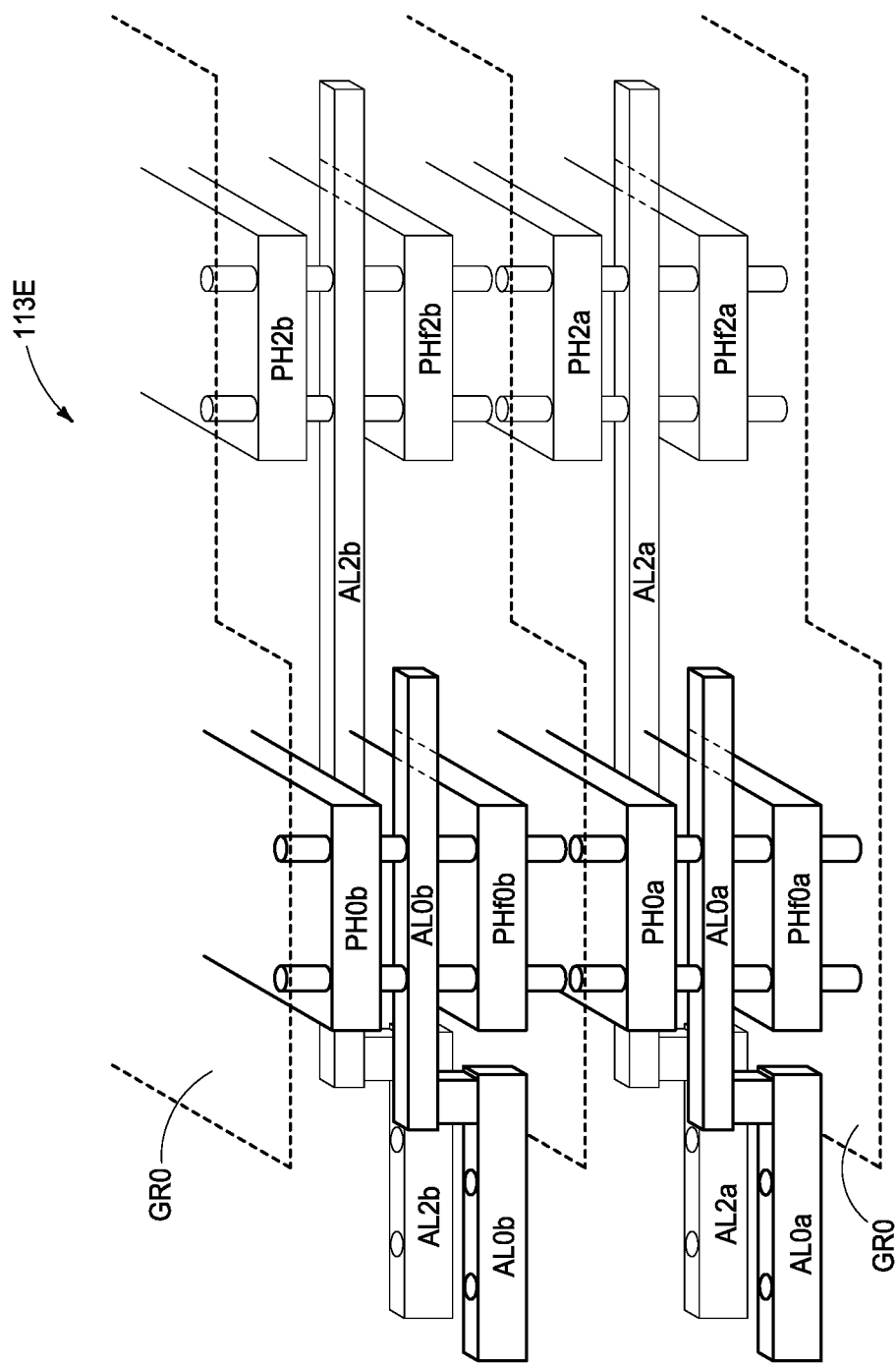
FIG. 8 is a diagrammatic perspective view of a portion of some possible structure of the FIG. 7 schematic figure.
Figure 9:
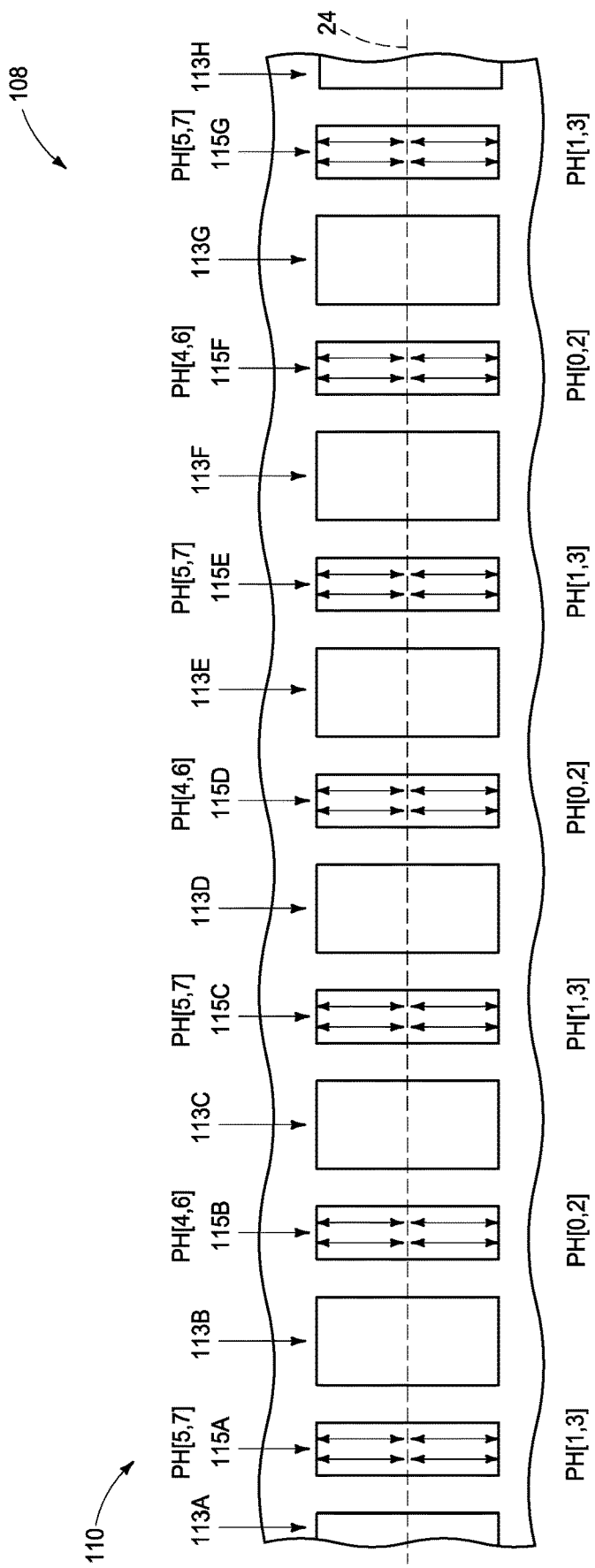
FIG. 9 is a diagrammatic expanded and reduced-scale horizontal representation of certain portions of the memory circuitry of FIG. 7.

Another example embodiment of memory circuitry 110 in accordance with the invention is shown and next described with reference to FIGS. 7-9. Like numerals from the above-described embodiments have been used where appropriate, with some differences being indicated with like numerals that have been incremented by addition of 100 to provide a 100 series of numerals. Memory-array stacks 113 may have essentially the same construction as described above with respect to memory-array stacks 13, with individual memory cells not being shown for clarity in FIGS. 7 and 8. Stacks 115 of access-line-driver circuitry may have essentially the same individual access-line-driver circuitry construction 25 in the first-described embodiments as described above (transistors T1, T2, T3, T4 being schematically shown in FIG. 7 as two transistors T1/T2 and T3/T4), but with different stacks 115 having different interconnection with immediately-adjacent memory array stacks 113. Specifically, memory circuitry 110 may be considered as comprising first-access-line-driver circuitry (e.g., any of 115B, 115D, 115F) between certain immediately-adjacent memory-array stacks (e.g., 113E and 113C, 113D and 113E, and 113E and 114G) and second access-line-driver circuitry (e.g., any of 115A, 115C, 115E, 115G) between another certain immediately-adjacent memory-array stacks (e.g., 113A and 113B, 113C and 113D, 113E and 113F, 113G and 113H) in horizontal line 24 (FIG. 6). Each of the first access-line-driver circuitry and the second access-line-driver circuitry controls access lines in each of its immediately-adjacent memory-array stack 113. However, the first access-line-driver circuitry couples to different individual ones of a first alternating set of access lines (e.g., even numbered AL lines 0 through 254) in that individual tier and the second access-line-driver circuitry couples to different individual ones of a second alternating set of access lines (e.g., odd numbered AL lines 1 through 255) in that individual tier. In one embodiment and as shown, each of the first and second alternating sets each comprises every other alternating ones of the access lines in that individual tier in the respective first or second alternating set. Alternately, by way of examples only, the alternating sets may alternate every three access lines, every four access lines, etc. or otherwise (not shown). Multiple physically-parallel gate lines analogous to that described above may also be used. Any other attribute(s) or aspect(s) as shown and/or described herein with respect to other embodiments may be used in the embodiments of FIGS. 7-9.

In this document unless otherwise indicated, "elevational", "higher", "upper", "lower", "top", "atop", "bottom", "above", "below", "under", "beneath", "up", and "down" are generally with reference to the vertical direction. "Horizontal" refers to a general direction (i.e., within 10 degrees) along a primary substrate surface and may be relative to which the substrate is processed during fabrication, and vertical is a direction generally orthogonal thereto. Reference to "exactly horizontal" is the direction along the primary substrate surface (i.e., no degrees there-from) and may be relative to which the substrate is processed during fabrication. Further, "vertical" and "horizontal" as used herein are generally perpendicular directions relative one another and independent of orientation of the substrate in three-dimensional space. Additionally, "elevationally-extending" and "extending elevationally" refer to a direction that is angled away by at least 45° from exactly horizontal. Further, "extend(ing) elevationally" and "elevationally-extending" with respect to a field effect transistor are with reference to orientation of the transistor's channel length along which current flows in operation between the source/drain regions. For bipolar junction transistors, "extend(ing) elevationally" and "elevationally-extending" are with reference to orientation of the base length along which current flows in operation between the emitter and collector.

Further, "directly above" and "directly under" require at least some lateral overlap (i.e., horizontally) of two stated regions/materials/components relative one another. Also, use of "above" not preceded by "directly" only requires that some portion of the stated region/material/component that is above the other be elevationally outward of the other (i.e., independent of whether there is any lateral overlap of the two stated regions/materials/components). Analogously, use of "under" not preceded by "directly" only requires that some portion of the stated region/material/component that is under the other be elevationally inward of the other (i.e., independent of whether there is any lateral overlap of the two stated regions/materials/components).

Any of the materials, regions, and structures described herein may be homogenous or non-homogenous, and regardless may be continuous or discontinuous over any material which such overlie. Further, unless otherwise stated, each material may be formed using any suitable or yet-to-be-developed technique, with atomic layer deposition, chemical vapor deposition, physical vapor deposition, epitaxial growth, diffusion doping, and ion implanting being examples.

Additionally, "thickness" by itself (no preceding directional adjective) is defined as the mean straight-line distance through a given material or region perpendicularly from a closest surface of an immediately-adjacent material of different composition or of an immediately-adjacent region. Additionally, the various materials or regions described herein may be of substantially constant thickness or of variable thicknesses. If of variable thickness, thickness refers to average thickness unless otherwise indicated, and such material or region will have some minimum thickness and some maximum thickness due to the thickness being variable. As used herein, "different composition" only requires those portions of two stated materials or regions that may be directly against one another to be chemically and/or physically different, for example if such materials or regions are not homogenous. If the two stated materials or regions are not directly against one another, "different composition" only requires that those portions of the two stated materials or regions that are closest to one another be chemically and/or physically different if such materials or regions are not homogenous. In this document, a material, region, or structure is "directly against" another when there is at least some physical touching contact of the stated materials, regions, or structures relative one another. In contrast, "over", "on", "adjacent", "along", and "against" not preceded by "directly" encompass "directly against" as well as construction where intervening material(s), region(s), or structure(s) result(s) in no physical touching contact of the stated materials, regions, or structures relative one another.

Herein, regions-materials-components are "electrically coupled" relative one another if in normal operation electric current is capable of continuously flowing from one to the other, and does so predominately by movement of subatomic positive and/or negative charges when such are sufficiently generated. Another electronic component may be between and electrically coupled to the regions-materials-components. In contrast, when regions-materials-components are referred to as being "directly electrically coupled", no intervening electronic component (e.g., no diode, transistor, resistor, transducer, switch, fuse, etc.) is between the directly electrically coupled regions-materials-components.

Additionally, "metal material" is any one or combination of an elemental metal, a mixture or an alloy of two or more elemental metals, and any conductive metal compound.

Use of "row" and "column" in this document is for convenience in distinguishing one series or orientation of lines from another series or orientation of lines and along which features have been or will be formed. "Row" and "column" are used synonymously with respect to any series of regions, components, and/or features independent of function. Regardless, the rows may be straight acid/or curved and/or parallel acid/or not parallel relative one another, as may be the columns. Further, the rows and columns may intersect relative one another at 90° or at one or more other angles.

In this document, two memory-array stacks are "immediately, adjacent" one another if there is no other memory-array stack between the two. In this document, two tiers are immediately adjacent one another if there is no other like tier between the two.

CONCLUSION

In some embodiments, memory circuitry comprises a stack of multiple tiers individually comprising memory cells individually comprising an elevationally-extending transistor. The tiers individually comprise multiple access lines that individually electrically couple together a row of the memory cells in that individual tier. The tiers individually comprise access-line-driver circuitry comprising an elevationally-extending transistor.

In some embodiments, memory circuitry comprises first, second, and third memory-array stacks individually having multiple tiers individually comprising memory cells. The memory cells individually comprise an elevationally-extending transistor. The tiers individually comprise multiple access lines that individually electrically couple together a row of the memory cells in that individual tier. The memory-array stacks are horizontally spaced from one another along a horizontal line. The second memory-array stack is between, horizontally spaced from, and immediately adjacent to each of the first and third memory-array stacks in the horizontal line. A stack of access-line-driver circuitry is between the second memory-array stack and one of the first or third memory-array stacks in the horizontal line. The access-line-driver circuitry is in individual of the tiers and individually comprises multiple elevationally-extending transistors that individually electrically couple to different individual of the access lines in that individual tier in each of the second memory-array stack and the one first or third memory-array stack. There is no stack of any access-line-driver circuitry between the second memory-array stack and the other of the first or third memory-array stack in the horizontal line.

In some embodiments, memory circuitry comprises multiple memory-array stacks individually having multiple tiers individually comprising memory cells individually comprising an elevationally-extending transistor. The tiers individually comprise multiple access lines that individually electrically couple together a row of the memory cells in that individual tier. The memory-array stacks are horizontally spaced from one another along a horizontal line. A stack of access-line-driver circuitry is between every other immediately adjacent of the memory-array stacks in the horizontal line. There is no stack of any access-line-driver circuitry in the horizontal line between any two immediately adjacent of the memory-array stacks other than said every other immediately-adjacent memory-array stack.

In some embodiments, memory circuitry comprises first, second, and third memory-array stacks individually having multiple tiers individually comprising memory cells. The memory cells individually comprise an elevationally-extending transistor. The tiers individually comprise multiple access lines that individually electrically couple together a row of the memory cells in that individual tier. The memory-array stacks are horizontally spaced from one another along a horizontal line. The second memory-array stack is between, horizontally spaced from, and immediately adjacent to each of the first and third memory-array stacks in the horizontal line. First access-line-driver circuitry is between the second memory-array stack and one of the first or third memory-array stacks in the horizontal line. Second access-line-driver circuitry is between the second memory-array stack and the other of the first or third memory-array stack in the horizontal line. The first access-line-driver circuitry is in individual of the tiers and comprises multiple elevationally-extending transistors that individually electrically couple to different individual ones of a first alternating set of the access lines in that individual tier in each of the second memory-array stack and the one first or third memory-array stack. The second access-line-driver circuitry is in the individual tiers and comprises multiple elevationally-extending transistors that individually electrically couple to different individual ones of a second alternating set of the access lines in that individual tier in each of the second memory-array stack and the other of the first or third memory-array stack.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. Memory circuitry comprising:
  a stack of multiple tiers individually comprising memory cells, the memory cells individually comprising an elevationally-extending transistor;
  the tiers individually comprising multiple access lines that individually electrically couple together a row of the memory cells in that individual tier;
  the tiers individually comprising access-line-driver circuitry comprising an elevationally-extending transistor;
  wherein the access-line-driver circuitry comprises multiple elevationally-extending transistors that individually electrically couple to different individual of the access lines in that individual tier; and
  wherein at least one of the at least two elevationally-extending transistors of the access-line-driver circuitry is electrically coupled with at least one of the at least two elevationally-extending transistors of the access-line-driver circuitry that is in an immediately-adjacent tier.

2. The memory circuitry of claim 1 wherein the access-line-driver circuitry comprises at least two elevationally-extending transistors that individually electrically couple to the same one of the different individual access lines.

3. The memory circuitry of claim 2 wherein one of the at least two elevationally-extending transistors of the access-line-driver circuitry in that individual tier is above another of the at least two elevationally-extending transistors of the access-line-driver circuitry in that individual tier.

4. The memory circuitry of claim 3 wherein the one of the at least two elevationally-extending transistors of the access-line-driver circuitry in that individual tier is directly above the other of the at least two elevationally-extending transistors of the access-line-driver circuitry in that individual tier.

5. The memory circuitry of claim 2 wherein at least one of the at least two elevationally-extending transistors of the access-line-driver circuitry is circuit-parallel with another of the at least two elevationally-extending transistors of the access-line-driver circuitry.

6. The memory circuitry of claim 2 wherein at least one of the at least two elevationally-extending transistors of the access-line-driver circuitry is not circuit-parallel with another of the at least two elevationally-extending transistors of the access-line-driver circuitry.

7. The memory circuitry of claim 1 wherein the memory cells individually comprise a capacitor.

8. The memory circuitry of claim 7 wherein the memory cells individually comprise multiple elevationally-extending transistors.

9. The memory circuitry of claim 8 wherein the multiple elevationally-extending transistors are vertical or within 10° of vertical.

10. The memory circuitry of claim 1 wherein the tiers individually comprise multiple digit lines that individually electrically couple together a column of the memory cells in that individual tier.

11. The memory circuitry of claim 1 wherein the access-line-driver circuitry in the individual tiers is horizontally spaced from all of the memory cells in the individual tiers.

12. The memory circuitry of claim 1 wherein the access-line-driver circuitry is between two memory cells.

13. Memory circuitry comprising:
first, second, and third memory-array stacks individually having multiple tiers individually comprising memory cells, the memory cells individually comprising an elevationally-extending transistor, the tiers individually comprising multiple access lines that individually electrically couple together a row of the memory cells in that individual tier, the memory-array stacks being horizontally spaced from one another along a horizontal line; the second memory-array stack being between, horizontally spaced from, and immediately adjacent to each of the first and third memory-array stacks in the horizontal line;
a stack of access-line-driver circuitry between the second memory-array stack and one of the first or third memory-array stacks in the horizontal line, the access-line-driver circuitry being in individual of the tiers and individually comprising multiple elevationally-extending transistors that individually electrically couple to different individual of the access lines in that individual tier in each of the second memory-array stack and the one first or third memory-array stack, there being no stack of any access-line-driver circuitry between the second memory-array stack and the other of the first or third memory-array stack in the horizontal line; and
wherein two of the multiple elevationally-extending transistors of the access-line-driver circuitry in that individual tier are oriented one above the other in that individual tier.

14. The memory circuitry of claim 13 comprising multiple physically-parallel gate lines between the second memory-array stack and the one first or third memory-array stack in the horizontal line in the individual tiers that individually electrically couple together a column of the elevationally-extending transistors of the access-line-driver circuitry in that individual tier.

15. The memory circuitry of claim 13 wherein at least one of the multiple elevationally-extending transistors of the access-line-driver circuitry is electrically coupled with at least another one of the multiple elevationally-extending transistors of the access-line-driver circuitry that is in an immediately-adjacent tier.

16. Memory circuitry comprising:
multiple memory-array stacks individually having multiple tiers individually comprising memory cells, the memory cells individually comprising an elevationally-extending transistor, the tiers individually comprising multiple access lines that individually electrically couple together a row of the memory cells in that individual tier, the memory-array stacks being horizontally spaced from one another along a horizontal line;
a stack of access-line-driver circuitry between every other immediately adjacent of the memory-array stacks in the horizontal line, there being no stack of any access-line-driver circuitry in the horizontal line between any two immediately adjacent of the memory-array stacks other than said every other immediately-adjacent memory-array stack;
wherein the access-line-driver circuitry of individual of the stacks of access-line-driver circuitry is in individual of the tiers and there comprises multiple elevationally-extending transistors that individually electrically couple to different individual of the access lines in that individual tier in each memory-array stack that is immediately adjacent that individual stack of access-line-driver circuitry in the horizontal line; and
wherein at least one of the multiple elevationally-extending transistors of the access-line-driver circuitry is electrically coupled with at least another one of the multiple elevationally-extending transistors of the access-line-driver circuitry that is in an immediately-adjacent tier.

17. The memory circuitry of claim 16 wherein the access-line-driver circuitry of individual of the stacks of access-line-driver circuitry is in individual of the tiers and there comprises multiple physically-parallel gate lines that individually electrically couple together a column of the elevationally-extending transistors of the access-line-driver circuitry in that individual tier.

18. The memory circuitry of claim 16 wherein two of the multiple elevationally-extending transistors of the access-line-driver circuitry in that individual tier are oriented one above the other in that individual tier.

19. Memory circuitry comprising:
first, second, and third memory-array stacks individually having multiple tiers individually comprising memory cells, the memory cells individually comprising an elevationally-extending transistor, the tiers individually comprising multiple access lines that individually electrically couple together a row of the memory cells in that individual tier, the memory-array stacks being horizontally spaced from one another along a horizontal line; the second memory-array stack being between, horizontally spaced from, and immediately adjacent to each of the first and third memory-array stacks in the horizontal line;
first access-line-driver circuitry between the second memory-array stack and one of the first or third memory-array stacks in the horizontal line and second access-line-driver circuitry between the second memory-array stack and the other of the first or third memory-array stack in the horizontal line;
the first access-line-driver circuitry being in individual of the tiers and comprising multiple elevationally-extending transistors that individually electrically couple to different individual ones of a first alternating set of the access lines in that individual tier in each of the second memory-array stack and the one first or third memory-array stack;
the second access-line-driver circuitry being in the individual tiers and comprising multiple elevationally-extending transistors that individually electrically couple to different individual ones of a second alternating set of the access lines in that individual tier in each of the second memory-array stack and the other of the first or third memory-array stack; and wherein two of the multiple elevationally-extending transistors of the first access-line-driver circuitry in that individual tier are oriented one above the other in that individual tier.

20. The memory circuitry of claim 19 wherein each of the first and second alternating sets each comprises every other alternating ones of the access lines in that individual tier in the respective first or second alternating set.

21. The memory circuitry of claim 19 comprising:
multiple physically-parallel gate lines between the second memory-array stack and the one first or third memory-array stack in the horizontal line in the individual tiers that individually electrically couple together a column of the elevationally-extending transistors of the first access-line-driver circuitry in that individual tier; and
multiple physically-parallel gate lines between the second memory-array stack and the other first or third memory-array stack in the horizontal line in the individual tiers that individually electrically couple together a column of the elevationally-extending transistors of the second access-line-driver circuitry in that individual tier.

22. The memory circuitry of claim 19 wherein at least one of the multiple elevationally-extending transistors of the first access-line-driver circuitry is electrically coupled with at least another one of the multiple elevationally-extending transistors of the second access-line-driver circuitry that is in an immediately-adjacent tier.

23. Memory circuitry comprising:
a stack of multiple tiers individually comprising memory cells, the memory cells individually comprising an elevationally-extending transistor;
the tiers individually comprising multiple access lines that individually electrically couple together a row of the memory cells in that individual tier;
the tiers individually comprising access-line-driver circuitry comprising an elevationally-extending transistor;
wherein the access-line-driver circuitry comprises multiple elevationally-extending transistors that individually electrically couple to different individual of the access lines in that individual tier;
wherein the access-line-driver circuitry comprises at least two elevationally-extending transistors that individually electrically couple to the same one of the different individual access lines; and
wherein one of the at least two elevationally-extending transistors of the access-line-driver circuitry in that individual tier is above another of the at least two elevationally-extending transistors of the access-line-driver circuitry in that individual tier.

24. The memory circuitry of claim 23 wherein the one of the at least two elevationally-extending transistors of the access-line-driver circuitry in that individual tier is directly above the other of the at least two elevationally-extending transistors of the access-line-driver circuitry in that individual tier.

25. Memory circuitry comprising:
first, second, and third memory-array stacks individually having multiple tiers individually comprising memory cells, the memory cells individually comprising an elevationally-extending transistor, the tiers individually comprising multiple access lines that individually electrically couple together a row of the memory cells in that individual tier, the memory-array stacks being horizontally spaced from one another along a horizontal line; the second memory-array stack being between, horizontally spaced from, and immediately adjacent to each of the first and third memory-array stacks in the horizontal line;
a stack of access-line-driver circuitry between the second memory-array stack and one of the first or third memory-array stacks in the horizontal line, the access-line-driver circuitry being in individual of the tiers and individually comprising multiple elevationally-extending transistors that individually electrically couple to different individual of the access lines in that individual tier in each of the second memory-array stack and the one first or third memory-array stack, there being no stack of any access-line-driver circuitry between the second memory-array stack and the other of the first or third memory-array stack in the horizontal line; and
wherein at least one of the multiple elevationally-extending transistors of the access-line-driver circuitry is electrically coupled with at least another one of the multiple elevationally-extending transistors of the access-line-driver circuitry that is in an immediately-adjacent tier.

26. Memory circuitry comprising:
multiple memory-array stacks individually having multiple tiers individually comprising memory cells, the memory cells individually comprising an elevationally-extending transistor, the tiers individually comprising multiple access lines that individually electrically couple together a row of the memory cells in that individual tier, the memory-array stacks being horizontally spaced from one another along a horizontal line;
a stack of access-line-driver circuitry between every other immediately adjacent of the memory-array stacks in the horizontal line, there being no stack of any access-line-driver circuitry in the horizontal line between any two immediately adjacent of the memory-array stacks other than said every other immediately-adjacent memory-array stack;
wherein the access-line-driver circuitry of individual of the stacks of access-line-driver circuitry is in individual of the tiers and there comprises multiple elevationally-extending transistors that individually electrically couple to different individual of the access lines in that individual tier in each memory-array stack that is immediately adjacent that individual stack of access-line-driver circuitry in the horizontal line; and
wherein two of the multiple elevationally-extending transistors of the access-line-driver circuitry in that individual tier are oriented one above the other in that individual tier.

27. Memory circuitry comprising:
first, second, and third memory-array stacks individually having multiple tiers individually comprising memory cells, the memory cells individually comprising an elevationally-extending transistor, the tiers individually comprising multiple access lines that individually electrically couple together a row of the memory cells in that individual tier, the memory-array stacks being horizontally spaced from one another along a horizontal line; the second memory-array stack being between, horizontally spaced from, and immediately adjacent to each of the first and third memory-array stacks in the horizontal line;
first access-line-driver circuitry between the second memory-array stack and one of the first or third memory-array stacks in the horizontal line and second access-line-driver circuitry between the second memory-array stack and the other of the first or third memory-array stack in the horizontal line;

the first access-line-driver circuitry being in individual of the tiers and comprising multiple elevationally-extending transistors that individually electrically couple to different individual ones of a first alternating set of the access lines in that individual tier in each of the second memory-array stack and the one first or third memory-array stack;

the second access-line-driver circuitry being in the individual tiers and comprising multiple elevationally-extending transistors that individually electrically couple to different individual ones of a second alternating set of the access lines in that individual tier in each of the second memory-array stack and the other of the first or third memory-array stack; and wherein at least one of the multiple elevationally-extending transistors of the first access-line-driver circuitry is electrically coupled with at least another one of the multiple elevationally-extending transistors of the second access-line-driver circuitry that is in an immediately-adjacent tier.

\* \* \* \* \*